(12) United States Patent
Hu et al.

(10) Patent No.: US 9,485,859 B1
(45) Date of Patent: Nov. 1, 2016

(54) FLEXIBLE CIRCUIT BOARD AND METHOD FOR MANUFACTURING SAME

(71) Applicants: FuKui Precision Component (Shenzhen) Co., Ltd., Shenzhen (CN); HongQiSheng Precision Electronics (QinHuangDao) Co., Ltd., Qinhuangdao (CN); Zhen Ding Technology Co., Ltd., Tayuan, Taoyuan (TW)

(72) Inventors: Xian-Qin Hu, Shenzhen (CN); Fu-Yun Shen, Shenzhen (CN); Jian Luo, Shenzhen (CN); Ming-Jaan Ho, New Taipei (TW); Yi-Qiang Zhuang, Shenzhen (CN)

(73) Assignees: FuKui Precision Component (Shenzhen) Co., Ltd., Shenzhen (CN); HongQiSheng Precision Electronics (QinHuangDao) Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/859,857

(22) Filed: Sep. 21, 2015

(30) Foreign Application Priority Data

Aug. 27, 2015 (CN) .............................. 201510535138

(51) Int. Cl.
| | | |
|---|---|---|
| *H05K 1/00* | (2006.01) | |
| *H05K 1/03* | (2006.01) | |
| *H05K 3/10* | (2006.01) | |
| *H05K 1/02* | (2006.01) | |
| *H05K 1/09* | (2006.01) | |
| *H05K 3/06* | (2006.01) | |
| *H05K 3/18* | (2006.01) | |
| *H05K 3/46* | (2006.01) | |

(52) U.S. Cl.
CPC .............. *H05K 1/0298* (2013.01); *H05K 1/09* (2013.01); *H05K 3/06* (2013.01); *H05K 3/188* (2013.01); *H05K 3/4652* (2013.01); *H05K 2201/0137* (2013.01); *H05K 2201/0355* (2013.01); *H05K 2201/05* (2013.01)

(58) Field of Classification Search
CPC .... H05K 1/09; H05K 2201/05; H05K 3/188; H05K 1/0298; H05K 3/06; H05K 3/4652; H05K 2201/0137; H05K 2201/0355
USPC ................................... 174/254, 255; 29/846
See application file for complete search history.

(56) References Cited

U.S. PATENT DOCUMENTS 5,571,608 A * 11/1996 Swamy ................ H05K 1/0287
174/255

(Continued)

*Primary Examiner* — Sherman Ng
(74) *Attorney, Agent, or Firm* — Zhigang Ma

(57) ABSTRACT

A flexible circuit board includes a first base layer, a circuit layer, a second base layer and a bonding layer. The circuit layer is coupled to a side of the first base layer and includes a linear signal line, two grounding lines located at two opposite sides of the linear signal line, and two hollow areas located between the linear signal line and the grounding lines. The bonding layer couples the second base layer to the circuit layer and defines a first opening corresponding to the linear signal line and communicating with the hollow areas of the circuit layer. The first opening of the bonding layer and the hollow areas of the circuit layer cooperatively define an air medium layer surrounding the linear signal line. A method for manufacturing the flexible circuit board is also provided.

20 Claims, 10 Drawing Sheets

(56) References Cited

U.S. PATENT DOCUMENTS 6,246,112 B1 * 6/2001 Ball .................. H01L 23/49822
257/690

2005/0224251 A1 * 10/2005 Memis .................. H01L 23/145
174/255
2008/0191353 A1 * 8/2008 Japp ...................... H01L 23/145
257/759

* cited by examiner

FLEXIBLE CIRCUIT BOARD AND METHOD FOR MANUFACTURING SAME

FIELD

The subject matter herein generally relates to printed circuit boards, and particularly to a flexible circuit board and a method for manufacturing the flexible circuit board.

BACKGROUND

Generally, flexible circuit boards are light, soft, thin, small, ductile, flexible, and supporting high wiring density. Flexible circuit boards can be three-dimensionally wired and shaped according to space limitations. Flexible circuits are generally useful for electronic packages where flexibility, weight control and the like are important.

BRIEF DESCRIPTION OF THE DRAWINGS

Implementations of the present technology will now be described, by way of example only, with reference to the attached figures.

DETAILED DESCRIPTION

Figure 1:
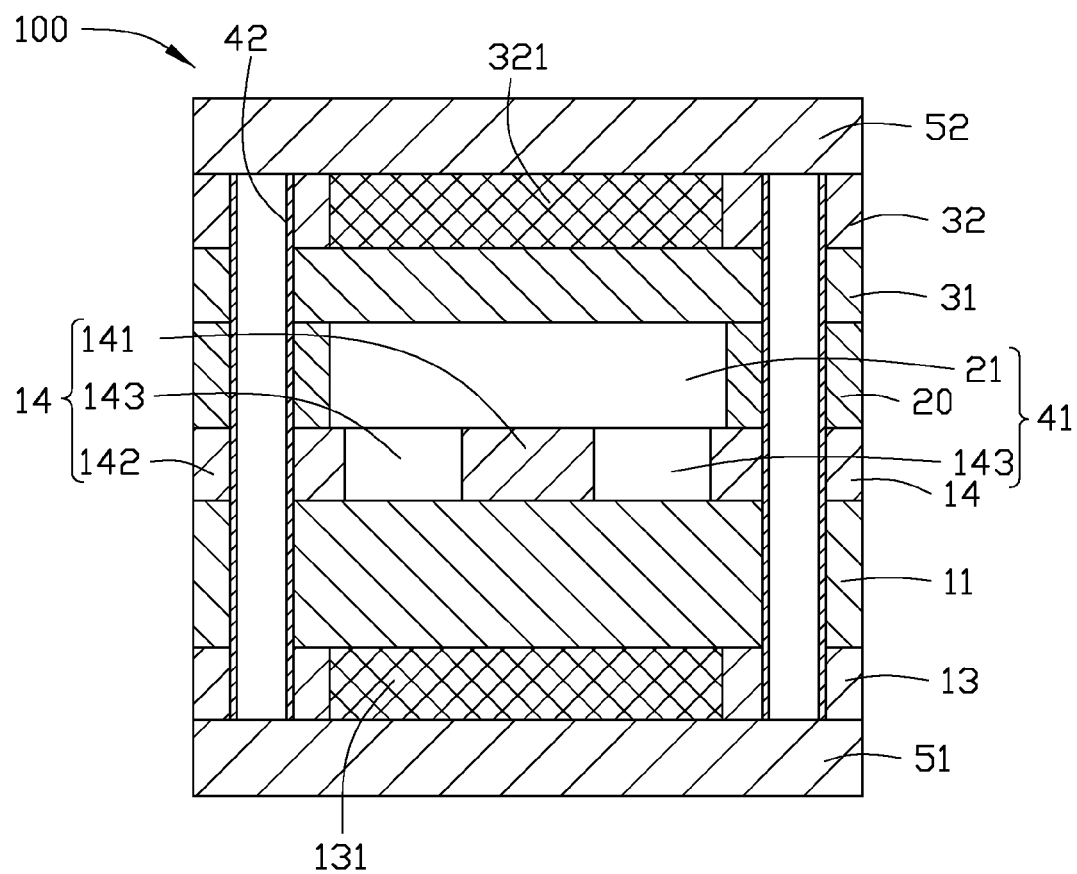
FIG. 1 is cross sectional view of a flexible circuit board in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure is described in relation to a flexible circuit board. The flexible circuit board can include a first base layer, a circuit layer, a second base layer and a bonding layer. The circuit layer is coupled to a side of the first base layer and includes a linear signal line, two grounding lines located at two opposite sides of the linear signal line, and two hollow areas located between the linear signal line and the grounding lines. The bonding layer couples the second base layer to the circuit layer and defines a first opening corresponding to the linear signal line and communicating with the hollow areas of the circuit layer. The first opening of the bonding layer and the hollow areas of the circuit layer cooperatively define an air medium layer surrounding the linear signal line.

The present disclosure is described further in relation to a method for manufacturing a flexible circuit board. The method can include followings. A first copper clad laminate is provided. The first copper clad laminate includes a first base layer, a copper foil and a first outer copper foil located at two opposite sides of the first base layer. A circuit layer is formed from the copper foil to comprise a linear signal line, two grounding lines located at two opposite sides of the linear signal line, and two hollow areas located between the linear signal line and the grounding lines. A bonding layer with a first opening is provided. A second copper clad laminate is provided and includes a second base layer and a second outer copper foil coupled to a side of the second base layer. The bonding layer and the second copper clad laminate are laminated on the circuit layer. The first opening of the bonding layer and the hollow areas of the circuit layer cooperatively define an air medium layer surrounding the linear signal line.

FIG. 1 illustrates a flexible circuit board 100 of an embodiment of the present disclosure. The flexible circuit board 100 can include a first base layer 11, a circuit layer 14 coupled to a side of the first base layer 11, a first outer copper foil 13 coupled to an opposite side of the first base layer 11, a bonding layer 20 coupled to the circuit layer 14, a second base layer 31 coupled to the bonding layer 20, a second copper foil 32 coupled to the second base layer 31, a first solder resist layer 51 coupled to the first outer copper foil 13, and a second solder resist layer 52 coupled to the second outer copper foil 32.

In at least one embodiment, the first base layer 11 can be flexible and provides support to the flexible circuit board 100. The first base layer 11 can be polyimide (PI).

The first outer copper foil 13 and the circuit layer 14 are located at two opposite sides of the first base layer 11.

In the illustrated embodiment, the first outer copper foil 13 can include a first grid area 131.

The circuit layer 14 can include at least a linear signal line 141, at least two grounding lines 142 and at least two hollow areas 143. In the illustrated embodiment, the circuit layer 14 includes one linear signal line 141, two grounding lines 142 and two hollow areas 143. The linear signal line 141 is located at a center portion of the circuit layer 14. In at least one embodiment, the linear signal line 141 can be in directly physical contact with the first base layer 11. The two grounding lines 142 are located at two opposite sides of the linear signal line 141. The two hollow areas 143 are located at two opposite sides of the linear signal line 141 and between the two grounding lines 142. The linear signal line 141 and the grounding lines 142 have the same extension directions.

In at least one embodiment, the linear signal line 141 can be electrically independent from the two grounding lines 142. The linear signal line 141 is configured to transmit signals.

The two grounding lines 142 can be parallel to each other. In at least one embodiment, the two grounding lines 142 can be symmetric to each other about the linear signal line 141.

Each hollow area 143 is located between the linear signal line 141 and a corresponding grounding line 142. The two hollow areas 143 separate the linear signal line 141 apart from the two grounding lines 142. The two hollow areas 143 can be symmetric to each other about the linear signal line 141. The first base layer 11 is exposed via the hollow areas 143.

Figure 2:
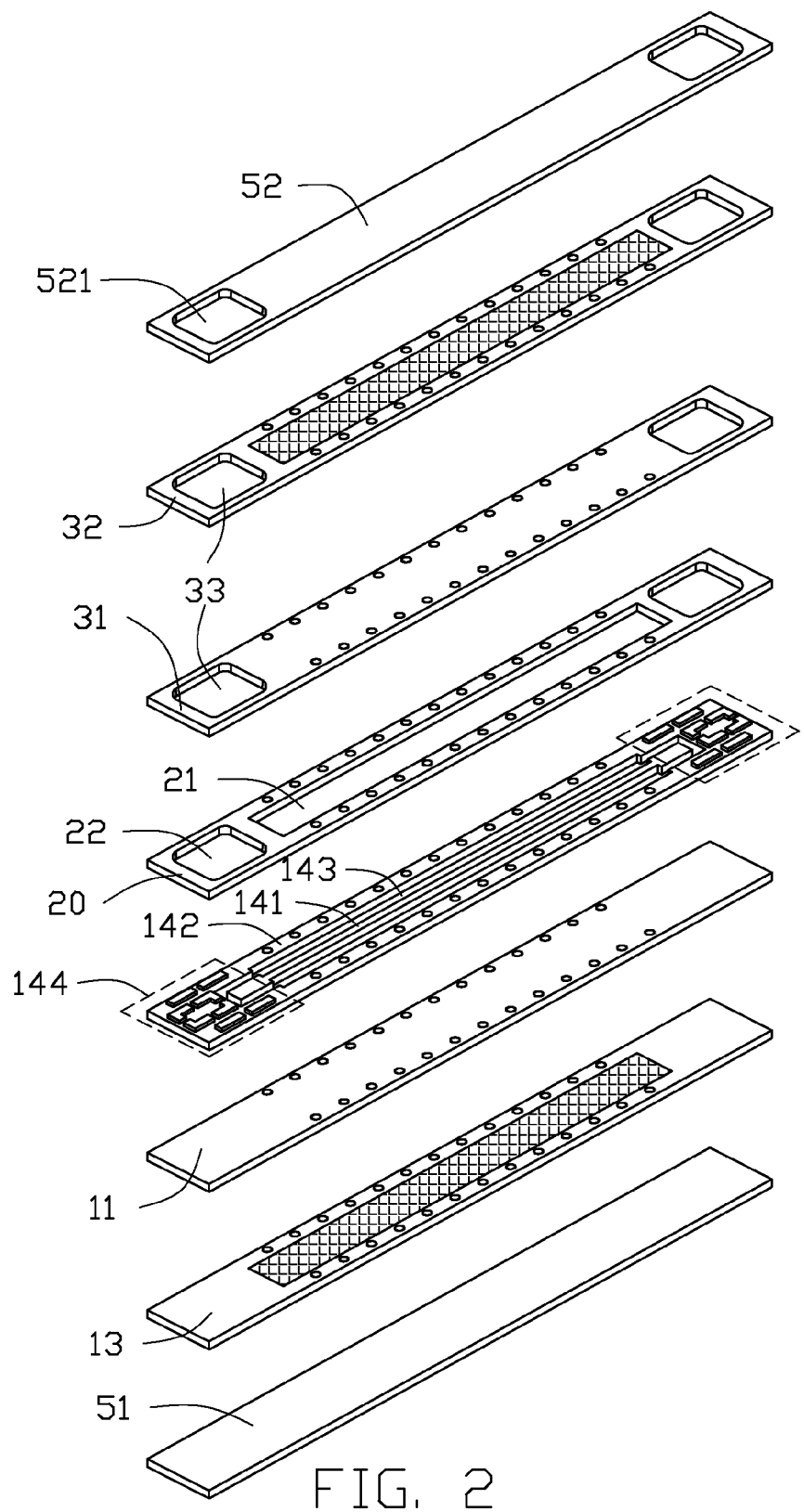
FIG. 2 is an exploded, isometric view the flexible circuit board in FIG. 1.

FIG. 2 illustrates that the circuit layer 14 can further include two connecting parts 144 configured to be coupled to external electronic components. The two connecting parts 144 are located at two opposite ends of the circuit layer 14. The linear signal line 141, the grounding lines 142 and the hollow areas 143 are located between the two connecting parts 144. The linear signal line 141, the grounding lines 142 and the hollow areas 143 each extend from one connecting part 144 to the other connecting part 144.

In at least one embodiment, the first grid area 131 of the first outer copper foil 13 is corresponding to the linear signal line 141 and the two hollow areas 143.

In at least one alternative embodiment, the circuit layer 14 can include a plurality of linear signal lines 141, two grounding lines 142 and a plurality of hollow areas 143. The plurality of linear signal lines 141 are located between the two grounding lines 142. Two of the plurality of hollow area 143 are defined between every two adjacent linear signal line 142 and grounding line 142, the other hollow areas 143 are defined between every two adjacent linear signal lines 142. Extension directions of the linear signal line 141, the grounding lines 142 and the hollow areas 143 are same to each other. The linear signal lines 141, the grounding lines 142 and the hollow areas 143 each extend from one connecting part 144 to the other connecting part 144.

In at least one alternative embodiment, the circuit layer 14 can include a plurality of linear signal lines 141, and a plurality of grounding lines 142 and a plurality of hollow areas 143. The linear signal lines 141 are alternately arranged with the grounding lines 142. Each hollow area 143 is defined between every two adjacent linear signal line 142 and grounding line 142. Extension directions of the linear signal line 141, the grounding lines 142 and the hollow areas 143 are same to each other. The linear signal lines 141, the grounding lines 142 and the hollow areas 143 each extend from one connecting part 144 to the other connecting part 144.

The bonding layer 20 is coupled between the circuit layer 14 and the second base layer 31. In at least one embodiment, the bonding layer 20 only contacts the grounding lines 142 of the circuit layer 14, and is spaced from the linear signal line 141 of the circuit layer 14.

The bonding layer 20 can define a first opening 21 and two second openings 22. The first opening 21 has nothing therein. The second openings 22 have nothing therein.

In at least one embodiment, the first opening 21 is defined in a central portion of the bonding layer 20 corresponding to the linear signal line 141 of the circuit layer 14. The first opening 21 is communicating with the hollow areas 143 of the circuit layer 14. The first opening 21 and the two hollow areas 143 of the circuit layer 14 cooperatively define an air medium layer 41 surrounding the linear signal line 141 on the first base layer 11. The air medium layer 41 is enclosed by the first base layer 11, the grounding lines 142 of the circuit layer 14, the bonding layer 20 and the second base layer 31. In at least one embodiment, the first openings 21 are corresponding to the linear signal line 141 and the two hollow areas 143 at two sides of the linear signal line 141. The first opening 21 has a size no less than a size of the linear signal line 141. The first opening 21 has a width larger than a width of the linear signal line 221. In at least one embodiment, the first opening 21 can have a width substantially larger than a total width of the linear signal line 141 and the two hollow areas 143.

The linear signal line 141 is spaced from the bonding layer 20 via the first opening 21. The linear signal line 141 is spaced from grounding lines 141, the bonding layer 20 and the second base layer 31 and surrounded by the air medium layer 41. A dielectric constant of the air medium layer is 1.0 farad/meter, which is less than a dielectric constant of Teflon or liquid crystal polymer, so that, after signals are transmitted by the linear signal line 141, loss of the signals is reduced.

The second openings 22 are corresponding to the two connecting parts 144 respectively. Each of the two connecting parts 144 is exposed via a corresponding second opening 22.

The second base layer 31 is coupled on the bonding layer 20. The second outer copper foil 32 is located at a side of the second base layer 31 opposite to bonding layer 20. The first base layer 11, the circuit layer 14, the bonding layer 20 and the second base layer 31 are located between the first outer copper foil 13 and the second outer copper foil 32.

The second base layer 31 and the second outer copper foil 32 define two through windows 33 corresponding to the second openings 22 and the connecting parts 144. Each of the two connecting parts 144 is exposed via the corresponding second opening 22 and a corresponding through window 33.

The second outer copper foil 32 includes a second grid area 321 corresponding to the linear signal line 141 and the two hollow areas 143.

The first solder resist layer 51 is coupled to an outer face of the first outer copper foil 13. The first solder resist layer 51 covers the outer face of the first outer copper foil 13 and is configured to prevent the first outer copper foil 13 from moisture or foreign body scraping. The first solder resist layer 51 can be a coverlay or printing ink.

The second solder resist layer 52 is coupled to an outer face of the second outer copper foil 32. The second solder resist layer 52 covers the outer face of the second outer copper foil 32 and is configured to prevent the second outer copper foil 32 from moisture or foreign body scraping. The second solder resist layer 52 can be a coverlay or printing ink.

The second solder resist layer 52 defines two slots 521 corresponding to the windows 33, the second openings 22 and the connecting parts 144. Each of the two connecting parts 144 is exposed via the corresponding second opening 22, the corresponding through window 33 and a corresponding slot 521.

The first outer copper foil 13, the first base layer 11, the circuit layer 14, the bonding layer 20, the second base layer 31 and the second outer copper foil 32 are located between the first solder resist layer 51 and the second solder resist layer 52.

The flexible circuit board 100 further includes a plurality of conductive holes 42. The conductive holes 42 electrically connect the first outer copper foil 13, the second outer copper foil 32 and the grounding lines 142 of the circuit layer 14. The plurality of conductive holes 42 can be through holes or blind holes. Each of the conductive holes 42 is filled with electric conductive material electrically coupled to the first outer copper foil 13, the second outer copper foil 32 and the grounding lines 142. In at least one embodiment, the conductive holes 42 extend through the first outer copper foil 13, the first base layer 11, the grounding lines 142, the second base layer 31 and the second outer copper foil 13. In the illustrated embodiment, the plurality of conductive holes 42 are located at two rows corresponding to the two grounding lines 142 respectively. In each row, the conductive holes 42 can evenly and spaced extend through a corresponding grounding line 142. Each of the conductive holes 4 can include a hollow space surrounded by the conductive material.

The conductive holes 42 are defined in the grounding lines 142 at two opposite sides of the linear signal line 141 and electrically connecting the grounding line 142, the first outer copper foil 13 and the second outer copper foil 32. The grounding lines 142, the first outer copper foil 13 and the second outer copper foil 32 cooperative form an electromagnetic shielding structure around the linear signal line 141 via connection of the conductive holes 42. The electromagnetic shielding structure is configured to protect the signals transmitted by the linear signal line 141 from electromagnetic interference.

Figure 3:
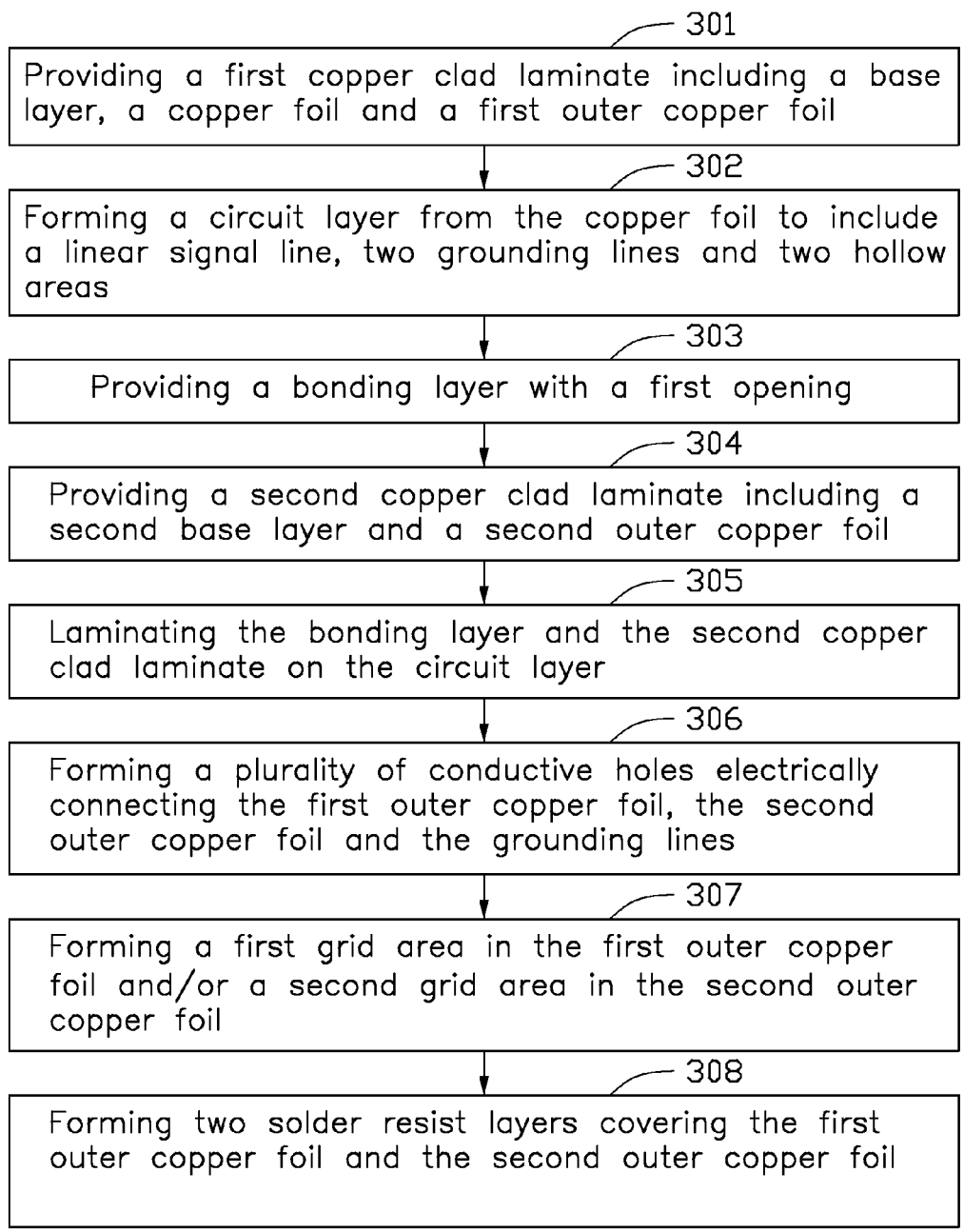
FIG. 3 is a flowchart of a method for manufacturing the flexible circuit board in FIG. 1.

FIG. 3 illustrates a flowchart of an example method for manufacturing the flexible circuit board 100. The example method is provided by way of example, as there are a variety of ways to carry out the method. The example method described below can be carried out using the configurations illustrated in FIGS. 1, 2 and 4-10, for example, and various elements of these figures are referenced in explaining the example method. Each block shown in FIG. 3 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 301.

Figure 4:
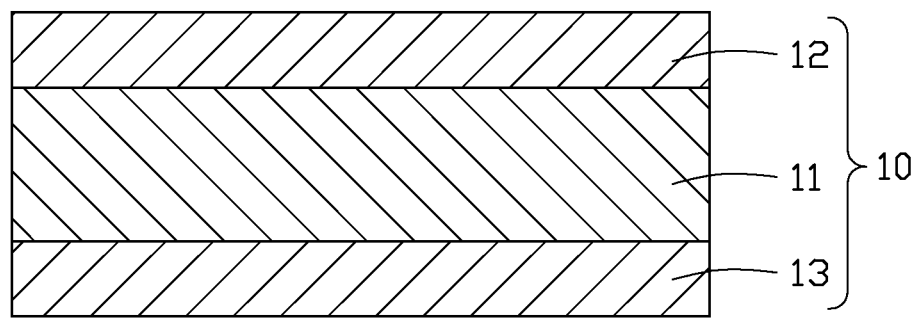
FIG. 4 is a cross sectional view of a first copper clad laminate before a circuit layer being formed.

At block 301, also referring to FIG. 4, a first copper clad laminate 10 is provided. The first copper clad laminate 10 can be a two-sided flexible copper foil laminate (FCCL). The first copper clad laminate 10 includes a base layer 11, a copper foil 12 and a first outer copper foil 13 coupled to two opposite sides of the first base layer 11. The first base layer 11 is located between the copper foil 12 and the first outer copper foil 13. The first base layer 11 can be polyimide (PI). The first base layer 11 is flexible and acts as a support layer of the first copper clad laminate 10.

Figure 5:
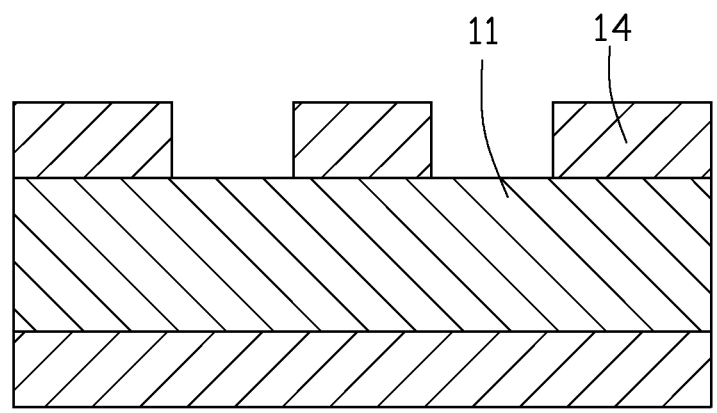
FIG. 5 is a cross sectional view of the copper clad laminate in FIG. 4 with the circuit layer formed.

At block 302, also referring to FIG. 5, a circuit layer 14 is formed from the copper foil 12. The circuit layer 14 is formed by electroplating, etching, punching or cutting. In at least one embodiment, the circuit layer 14 is formed by etching the first copper coil 12.

FIG. 2 illustrates that the circuit layer 14 can include at least a linear signal line 141, at least two grounding lines 142 and at least two hollow areas 143. In the illustrated embodiment, the circuit layer 14 includes one linear signal line 141, two grounding lines 142 and two hollow areas 143. The linear signal line 141 is located at a center portion of the circuit layer 14. The two grounding lines 142 are located at two opposite sides of the linear signal line 141. The two hollow areas 143 are located at two opposite sides of the linear signal line 141 and between the two grounding lines 142. The linear signal line 141 and the grounding lines 142 have the same extension directions.

In at least one embodiment, the linear signal line 141 can be electrically independent from two grounding lines 142. The linear signal line 141 is configured to transmit signals.

The two grounding lines 142 can be parallel to each other. In at least one embodiment, the two grounding lines 142 can be symmetric to each other about the linear signal line 141.

Each hollow area 143 is located between the linear signal line 141 and a corresponding grounding line 142. The two hollow areas 143 separate the linear signal line 141 apart from the two grounding lines 142. The two hollow areas 143 can be symmetric to each other about the linear signal line 141. The first base layer 11 is exposed via the hollow areas 143.

The circuit layer 14 can further include two connecting parts 144 configured to be coupled to external electronic components. The two connecting parts 144 are located at two opposite ends of the circuit layer 14. The linear signal line 141, the grounding lines 142 and the hollow areas 143 are located between the two connecting parts 144. The linear signal line 141, the grounding lines 142 and the hollow areas 143 each extend from one connecting part 144 to the other connecting part 144.

In at least one embodiment, the first grid area 131 of the first outer copper foil 13 is corresponding to the linear signal line 141 and the two hollow areas 143.

In at least one alternative embodiment, the circuit layer 14 can include a plurality of linear signal lines 141, two grounding lines 142 and a plurality of hollow areas 143. The plurality of linear signal lines 141 are located between the two grounding lines 142. Two of the plurality of hollow area 143 are defined between every two adjacent linear signal line 142 and grounding line 142, the other hollow areas 143 are defined between every two adjacent linear signal lines 142. Extension directions of the linear signal line 141, the grounding lines 142 and the hollow areas 143 are same to each other. The linear signal lines 141, the grounding lines 142 and the hollow areas 143 each extend from one connecting part 144 to the other connecting part 144.

In at least one alternative embodiment, the circuit layer 14 can include a plurality of linear signal lines 141, and a plurality of grounding lines 142 and a plurality of hollow areas 143. The linear signal lines 141 are alternately arranged with the grounding lines 142. Each hollow area 143 is defined between every two adjacent linear signal line 142 and grounding line 142. Extension directions of the linear signal line 141, the grounding lines 142 and the hollow areas 143 are same to each other. The linear signal lines 141, the grounding lines 142 and the hollow areas 143 each extend from one connecting part 144 to the other connecting part 144.

Figure 6:
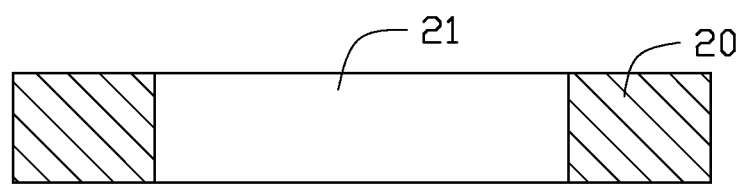
FIG. 6 is a cross sectional view of a bonding layer.

At block 303, also referring to FIG. 6, a bonding layer 20 defining a first opening 21 is provided. The first opening 21 has no adhesive therein. In at least one embodiment, the bonding layer 20 is punched to form the first opening 21. The first opening 21 is corresponding to the linear signal line 141 and the hollow areas 143 of the circuit layer 14. FIG. 2 illustrates that the bonding layer 20 further defines two second openings 22 corresponding to the two connecting parts 144 respectively. Each of the two connecting parts 144 is exposed via a corresponding second opening 22.

Figure 7:
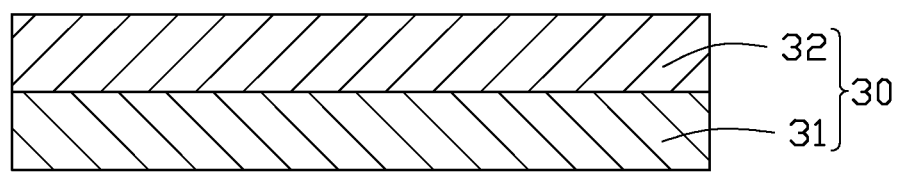
FIG. 7 is a cross sectional view of a second copper clad laminate.

At block 304, also referring to FIG. 7, a second copper clad laminate 30 is provided. The second copper clad laminate 30 can be a single-sided flexible copper foil laminate (FCCL). The second copper clad laminate 30 includes a second base layer 31 and a second outer copper foil 32 coupled to a side of the second base layer 31. The second base layer 11 can be polyimide (PI). FIG. 2 illustrates that the second copper clad laminate 30 defines two through windows 33 extending through the second base layer 31 and the second outer copper foil 32.

Figure 8:
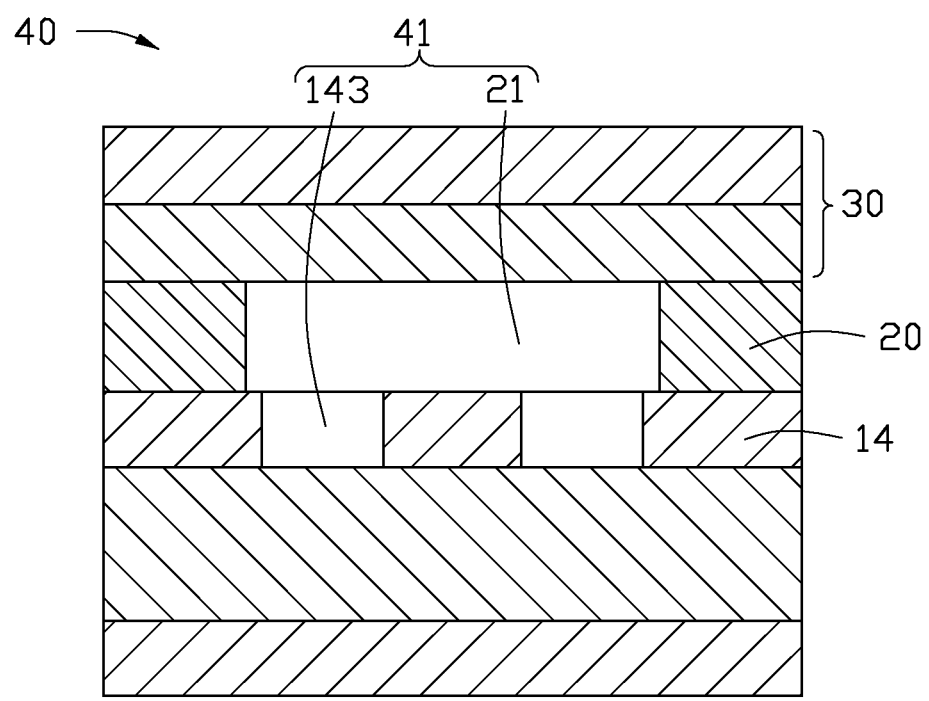
FIG. 8 is a diagrammatic view showing a bonding structure of the in first copper clad laminate in FIG. 5, the bonding layer in FIG. 6 and the second copper clad laminate in FIG. 7.

At block 305, also referring to FIG. 8, the bonding layers 20 and the second copper clad laminate 30 are laminated on the circuit layer 14. The bonding layers 20 and the second copper clad laminate 30, and the first copper clad laminate 10 with the circuit layer 14 are bonded together to form a laminated base 40. The bonding layer 20 is adhered to the circuit layer 14. The windows 33, the second openings 22 and the connecting parts 144 are corresponding to each other. Each of the two connecting parts 144 is exposed via the corresponding second opening 22 and a corresponding through window 33.

In the laminated base 40, the first opening 21 is corresponding to the linear signal line 141 and the hollow areas 143. The bonding layer 20 is spaced from the linear signal line 141 of the circuit layer 14 by the first opening 21. The first opening 21 is communicating with the hollow areas 143 of the circuit layer 14. The first opening 21 and the two hollow areas 143 of the circuit layer 14 cooperatively define an air medium layer 41 surrounding the linear signal line 141 on the first base layer 11. The air medium layer 41 is enclosed by the first base layer 11, the grounding lines 142 of the circuit layer 14, the bonding layer 20 and the second base layer 31. In at least one embodiment, the first opening 21 can have a width substantially larger than a total width of the linear signal line 141 and the two hollow areas 143.

Figure 9:
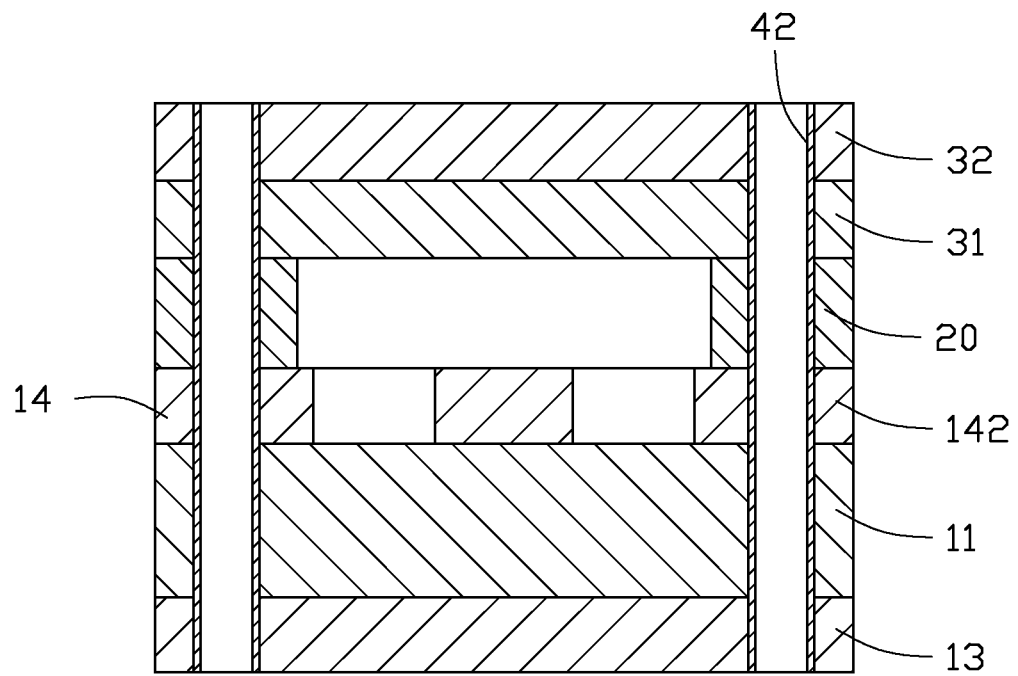
FIG. 9 is a diagrammatic view showing the boding structure in FIG. 8 with a plurality of conductive holes.

At block 306, also referring to FIG. 9, a plurality of conductive holes 42 are formed in the laminated base 40 to electrically connect the first outer copper foil 13, the second outer copper foil 32 and the grounding lines 142 of the circuit layer 14. The conductive holes 42 can be formed by method of follows. The first outer copper foil 13, the first base layer 11, the circuit layer 14, the bonding layer 20, the second base layer 31 and the second outer copper foil 32 defines a plurality of the through holes or blind holes by laser ablation or mechanical drilling. Each of the through holes or blind holes are filled with conductive material. Each of the conductive holes 42 can include a hollow space surrounded by the conductive material. FIG. 2 illustrates that, the plurality of conductive holes 42 are located at two rows corresponding to the two grounding lines 142 respectively. In each row, the conductive holes 42 can evenly and spaced extend through a corresponding grounding line 142.

Figure 10:
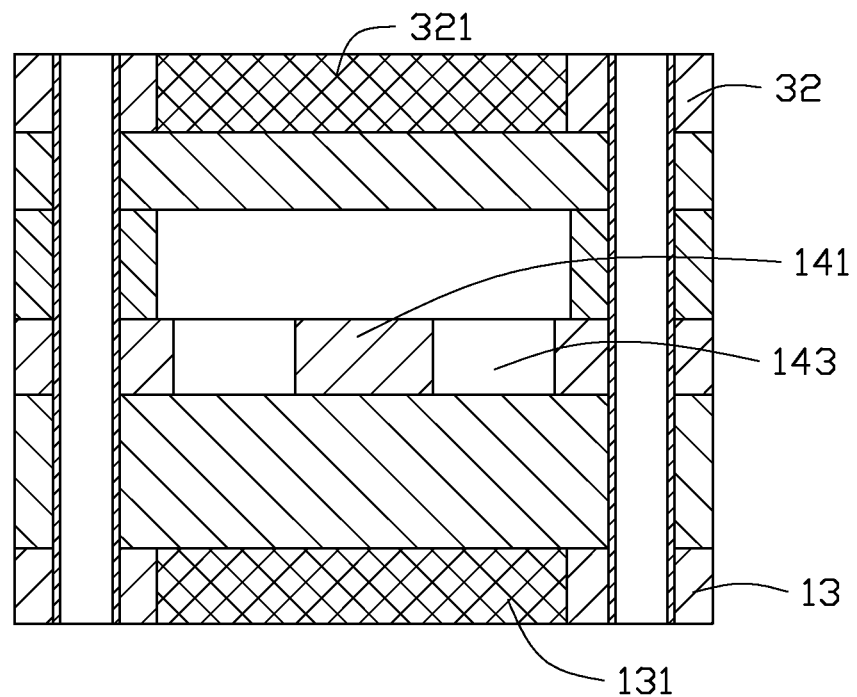
FIG. 10 is a diagrammatic view showing the bonding structure in FIG. 9 with a first grid area and a second grid area.

At block 307, also referring to FIG. 10, the first outer copper foil 13 forms a first grid area 131 corresponding to the linear signal line 141 and the hollow areas 143 of the circuit layer 14. The second outer copper foil 32 forms a second grid area 321 corresponding to the linear signal line 141 and the hollow areas 143 of the circuit layer 14. In at least one embodiment, the first outer copper foil 13 and the second outer copper foil 32 are etched to form the first grid area 131 and the second grid area 321. Density degrees of the first grid area 131 and second grid area 321 can be set according to signal frequency of signals transmitted by the linear signal line 141, to enhance electromagnetic shielding effect.

In at least one embodiment, only one or neither of the first outer copper foil 13 and the second outer copper foil 32 forms the grid area.

At block 308, also referring to FIG. 1, a first resist layer 51 is coupled to an outer face of the first outer copper foil 13. A second solder resist layer 52 is coupled to an outer face of the second outer copper foil 32.

The first solder resist layer 51 covers the outer face of the first outer copper foil 13 and is configured to prevent the first outer copper foil 13 from moisture or foreign body scraping. The first solder resist layer 51 can be a coverlay or printing ink.

The second solder resist layer 52 covers the outer face of the second outer copper foil 32 and is configured to prevent the second outer copper foil 32 from moisture or foreign body scraping. The second solder resist layer 52 can be a coverlay or printing ink.

The second solder resist layer 52 defines two through slots 521 corresponding to the windows 33, the second openings 22 and the connecting parts 144. Each of the two connecting parts 144 is exposed via the corresponding second opening 22, the corresponding through window 33 and a corresponding slot 521.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A flexible circuit board comprising:
   a first base layer;
   a circuit layer coupled to a side of the first base layer and comprising a linear signal line, two grounding lines located at two opposite sides of the linear signal line, and two hollow areas located between the linear signal line and the grounding lines;
   a second base layer; and
   a bonding layer coupling the second base layer to the circuit layer and defining a first opening corresponding to the linear signal line and communicating with the hollow areas of the circuit layer;
   wherein the first opening of the bonding layer and the hollow areas of the circuit layer collectively define an air medium layer surrounding the linear signal line.

2. The flexible circuit board of claim 1, wherein the first opening has a width larger than a total width of the linear signal line and the hollow areas of the circuit layer.

3. The flexible circuit board of claim 1, wherein the circuit layer further comprises two connecting parts configured to be coupled to external electronic components.

4. The flexible circuit board of claim 3, wherein the linear signal line and the grounding lines are located between the two connecting parts.

5. The flexible circuit board of claim 3, wherein the bonding layer defines two second openings corresponding to the two connecting parts, respectively, the two connecting parts being exposed via the two second opening.

6. The flexible circuit board of claim 5, wherein the second base layer defines two through windows corresponding to the two second openings and the two connecting parts, the two connecting parts being exposed via the two second opening and the two through windows.

7. The flexible circuit board of claim 6, further comprising an outer copper foil coupled to the second base layer, wherein the two through windows extend through the outer copper foil.

8. The flexible circuit board of claim 7, wherein the outer copper foil comprises a grid area corresponding to the linear signal line and the hollow areas.

9. The flexible circuit board of claim 7, further comprising an additional outer copper foil coupled to the first base layer, wherein the first base layer, the circuit layer, the bonding layer and the second base layer are located between the outer copper foil and the additional outer copper foil.

10. The flexible circuit board of claim 9, wherein the additional outer copper foil comprises a grid area corresponding to the linear signal line and the hollow areas.

11. The flexible circuit board of claim 9, further comprising a plurality of conductive holes electrically coupling the outer copper foil, the additional outer copper foil and the grounding lines.

12. The flexible circuit board of claim 9, further comprising two solder resist layers coupled to the outer copper foil and the additional outer copper foil, respectively, wherein the additional outer copper foil, the first base layer, the circuit layer, the bonding layer, the second base layer and the outer copper foil are located between the two solder resist layers.

13. The flexible circuit board of claim 1, wherein the two grounding lines of the circuit layer are parallel to each other.

14. A method for manufacturing a flexible circuit board, comprising: providing a first copper clad laminate comprising a first base layer, a copper foil and a first outer copper foil located at two opposite sides of the first base layer; forming a circuit layer from the copper foil to comprise a linear signal line, two grounding lines located at two opposite sides of the linear signal line, and two hollow areas located between the linear signal line and the grounding lines; providing a bonding layer with a first opening; the first opening corresponding to the linear signal line and communicating with the hollow areas of the circuit layer; providing a second copper clad laminate comprising a second base layer and a second outer copper foil coupled to a side of the second base layer; and laminating the bonding layer and the second copper clad laminate on the circuit layer; wherein the first opening of the bonding layer and the hollow areas of the circuit layer cooperatively define an air medium layer surrounding the linear signal line.

15. The method of claim 14, wherein the circuit layer is formed by etching or electroplating.

16. The method of claim 14, wherein the circuit layer further comprises two connecting parts configured to be coupled to external electronic components, the bonding layer further defining two second openings corresponding to the two connecting parts, respectively, the two connecting parts being exposed via the two second openings.

17. The method of claim 16, wherein the second copper clad laminate defines two through windows corresponding to the two second openings and the two connecting parts, the two connecting parts being exposed via the two second openings and the two through windows.

18. The method of claim 14, further comprising: forming a plurality of conductive holes in the first copper clad laminate, the bonding layer and the second copper clad laminate to electrically connect the first outer copper foil, the second outer copper foil and the grounding lines of the circuit layer.

19. The method of claim 14, further comprising: forming a first grid area in the first outer copper foil and/or a second grid area in the second outer copper foil corresponding to the linear signal line and the hollow areas of the circuit layer.

20. The method of claim 14, further comprising: forming two solder resist layers covering the first outer copper foil and the second outer copper foil.

* * * * *